(12) United States Patent
Truong et al.

(10) Patent No.: US 9,537,308 B2
(45) Date of Patent: Jan. 3, 2017

(54) ESD PROTECTION USING SHARED RC TRIGGER

(71) Applicant: Lattice Semiconductor Corporation, Hillsboro, OR (US)

(72) Inventors: Keith Truong, San Jose, CA (US); Brad Sharpe-Geisler, San Jose, CA (US); Ravi Lall, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 410 days.

(21) Appl. No.: 14/095,310

(22) Filed: Dec. 3, 2013

(65) Prior Publication Data

US 2015/0155707 A1 Jun. 4, 2015

(51) Int. Cl.
*H02H 9/04* (2006.01)
*H02H 3/20* (2006.01)
*H01L 27/02* (2006.01)

(52) U.S. Cl.
CPC .............. *H02H 9/046* (2013.01); *H02H 3/20* (2013.01); *H01L 27/0248* (2013.01)

(58) Field of Classification Search
CPC ........ H02H 9/046; H02H 3/20; H01L 27/0248
See application file for complete search history.

(56) References Cited

U.S. PATENT DOCUMENTS

| | | | |
|---|---|---|---|
| 5,946,177 A * | 8/1999 | Miller | H01L 27/0248 361/56 |
| 6,262,873 B1 | 7/2001 | Pequignot et al. | |
| 6,740,936 B1 | 5/2004 | Gitlin et al. | |
| 7,298,599 B1 * | 11/2007 | Vashchenko | H01L 27/0266 361/56 |
| 7,468,617 B1 | 12/2008 | Sengupta et al. | |
| 7,812,674 B2 | 10/2010 | Karp | |
| 8,134,813 B2 | 3/2012 | Karp et al. | |
| 8,218,277 B2 | 7/2012 | Li et al. | |
| 2003/0039084 A1 * | 2/2003 | Hatzilambrou | H01L 27/0292 361/56 |
| 2004/0027742 A1 * | 2/2004 | Miller | H01L 27/0251 361/52 |
| 2012/0124531 A1 * | 5/2012 | Chiang | G06F 17/5072 716/55 |
| 2012/0250195 A1 * | 10/2012 | Chang | H02H 9/046 361/56 |
| 2013/0215541 A1 | 8/2013 | Karp | |
| 2014/0347342 A1 * | 11/2014 | Reithmaier | G09G 3/3659 345/212 |

\* cited by examiner

*Primary Examiner* — Zeev V Kitov
(74) *Attorney, Agent, or Firm* — Haynes and Boone, LLP

(57) ABSTRACT

In one embodiment, an integrated circuit includes multiple I/O banks, each bank having multiple I/O-ESD tiles, each tile having one or more I/O circuits and electrostatic discharge (ESD) protection circuitry for the one or more I/O circuits in the tile. The ESD circuitry for one tile includes at least one RC-triggered clamp, whose resistance is provided by a resistor shared by one or more other RC-triggered clamps in one or more other tiles of the same bank and whose capacitance is provided by a combination of distributed capacitors, one for each of those two or more RC-triggered clamps. Each tile may have multiple instances of such RC-triggered clamps providing ESD protection for different (e.g., power supply and/or bus) nodes. The shared resistors are variable to allow different instances of the same ESD circuitry design to be implemented with the same time constant for different banks having different numbers of tiles.

11 Claims, 6 Drawing Sheets

ESD PROTECTION USING SHARED RC TRIGGER

BACKGROUND

Field of the Invention

The present invention relates to electronics and, more specifically but not exclusively, to electrostatic discharge (ESD) protection schemes for integrated circuits and the like.

Description of the Related Art

This section introduces aspects that may help facilitate a better understanding of the invention. Accordingly, the statements of this section are to be read in this light and are not to be understood as admissions about what is prior art or what is not prior art.

Electrostatic discharge (ESD) is a transient discharge of static charge flowing through an integrated circuit (IC) that arises from either human handling or machine contact. In order to prevent damage to core circuitries, it is standard industry practice to provide ICs with built-in ESD structures designed to handle ESD events. One common technique is to employ an RC (resistance-capacitance)-triggered clamp having a shunt transistor that turns on upon the occurrence of an ESD event to provide a path that shunts the ESD voltage and current from the ESD-affected node to ground and then turns off after the ESD event is over. The shunt transistor is controlled by an RC trigger consisting of a series combination of a resistor and a capacitor that establishes an RC time constant that controls the timing of the turning on and off of the shunt transistor.

A typical IC may have a different instance of ESD circuitry for each different group of input/output (I/O) circuits in the IC, where each instance of ESD circuitry may have multiple RC-triggered clamps protecting, for example, different nodes associated with different IC power supplies. In general, it is typically desirable to minimize the amount of layout area dedicated to such ESD circuitry.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
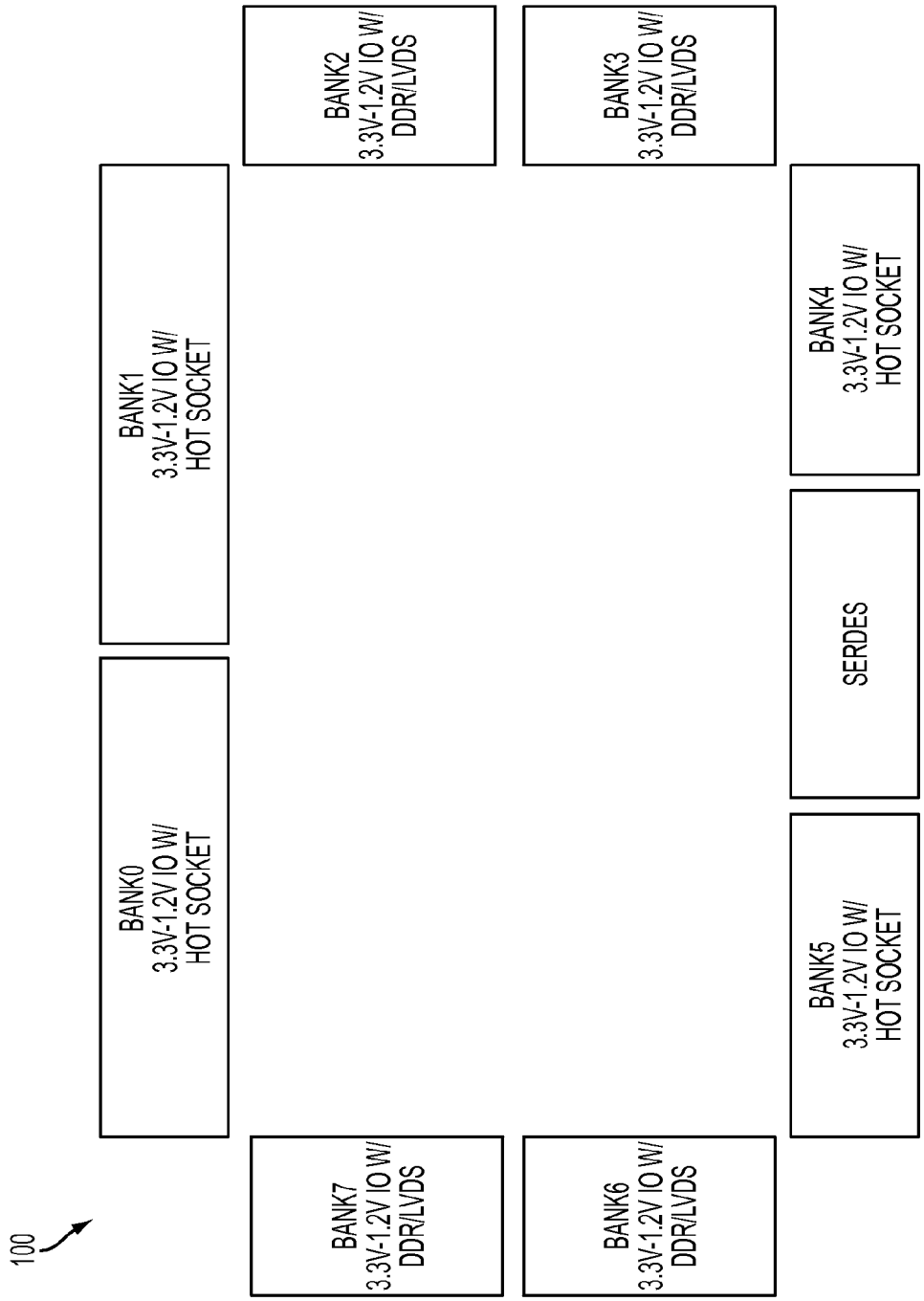
FIG. 1 shows a simplified diagram of the I/O banking scheme of an exemplary integrated circuit of the disclosure.

FIG. 1 shows a simplified diagram of the I/O banking scheme of an exemplary integrated circuit 100 of the disclosure. This particular I/O banking scheme has eight I/O banks (labeled BANK0-BANK7), where BANK0, BANK1, BANK4, and BANK5 contain 3.3V-1.2V I/O circuits with hot socket capability; BANK2, BANK5, BANK6, and BANK7 are 3.3V-1.2V I/O circuits for DDR (dual or double data rate) and/or LVDS (low-voltage differential signaling) applications. In addition, integrated circuit 100 has a serializer/deserializer (SERDES) that is separate from and independent of the IC's I/O banking scheme.

Although not shown in FIG. 1, each I/O bank has a plurality of I/O circuits arranged in groups of I/O circuits referred to as I/O-ESD tiles. For example, a bank of 64 I/O circuits may be arranged in eight I/O-ESD tiles, each tile having eight I/O circuits. In addition to the eight I/O circuits, each I/I-ESD tile also has ESD circuitry that provides ESD protection to the eight I/O circuits in that tile. Depending on the particular implementation, other I/O banks in the same IC may have the same number (i.e., eight), fewer (e.g., four or six), or more (e.g., twelve or sixteen) I/O-ESD tiles, where each tile still has eight I/O circuits protected by a corresponding set of ESD circuitry.

Figure 2:
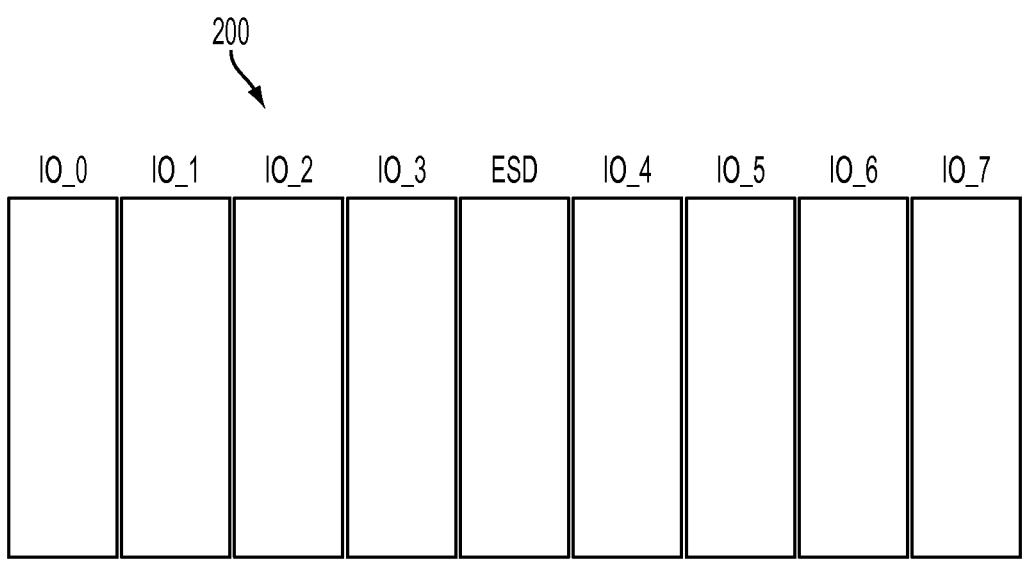
FIG. 2 shows a simplified diagram of an I/O-ESD tile having eight I/O circuits and centralized ESD circuitry configured to provide ESD protection to those eight I/O circuits.

FIG. 2 shows a simplified diagram of an I/I-ESD tile 200 having eight I/O circuits IO_0 to IO_7 and centralized ESD circuitry configured to provide ESD protection to those eight I/O circuits. Depending on the particular application, I/O-ESD tile 200 may be in an I/O bank that supports hot socket capability, such as BANK0, BANK1, BANK4, or BANK5 of FIG. 1, or I/O-ESD tile 200 may be in an I/O bank that does not support hot socket capability, such as BANK2, BANK3, BANK6, or BANK7 of FIG. 1. As described further below in the context of FIGS. 3 and 4, the design of the I/O-ESD tile may be different depending on whether the tile is deployed in an I/O bank that does or does not support hot socket capability.

Figure 3:
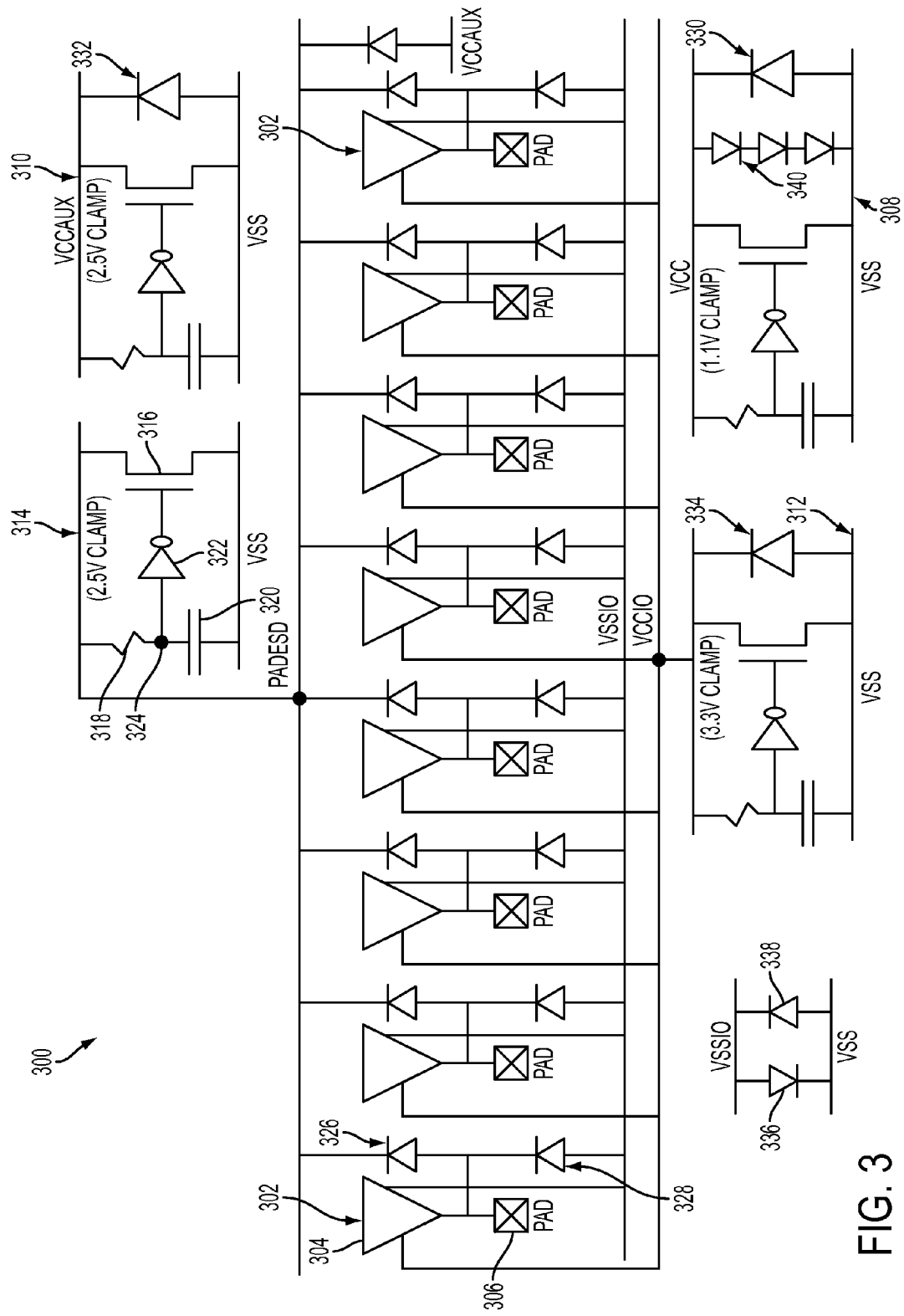
FIG. 3 shows a simplified schematic diagram of an exemplary I/O-ESD tile with ESD circuitry designed to provide ESD protection for eight I/O circuits having hot socket capability in an I/O bank of the IC of FIG. 1.

FIG. 3 shows a simplified schematic diagram of an exemplary I/O-ESD tile 300 with ESD circuitry designed to provide ESD protection for eight I/O circuits 302 having hot socket capability in an I/O bank of IC 100 of FIG. 1. IC 100 includes three power supplies VCC, VCCAUX, and VCCIO. In this exemplary IC, power supply node VCC has a maximum voltage of 1.1V, power supply node VCCAUX has a maximum voltage of 2.5V, and power supply node VCCIO has a maximum voltage of 3.3V. Associated with these three power supplies are two ground nodes: external ground node VSS and internal ground node VSSIO, which is less noisy than the externally grounded node VSS. In FIG. 3, each of the eight I/O circuits 302 is depicted by an I/O driver 304 and an I/O pad 306.

In general, an ESD event may occur at any I/O port of an IC. Thus, in the IC of FIG. 3, an ESD event may occur at any one or more of the eight pads 306 and/or at any one or more of the three power supply nodes VCC, VCCAUX, and VCCIO and/or at the external ground node VSS. Furthermore, an ESD event may be in the form of a positive voltage level or a negative voltage level. I/O-ESD tile 300 comprises ESD circuitry designed to handle any and all of these different types of ESD events.

In particular, I/O-ESD tile 300 has four different RC-triggered clamps: one (308, 310, 312) for each of the three power supply nodes VCC, VCCAUX, and VCCIO and one (314) for bus PADESD, which is an intermediate bus that provides an ESD discharge path from I/O pad 306 through diode 326 to RC-triggered clamp 314. The PADESD bus is provided because hot socket functionality does not allow the pMOS N-wells to be directly tied to the VCCIO power supply. Instead, the pMOS N-wells are tied to a floating NWELL node, which is handled by an NWELL switcher (not shown) of the hot-socket circuit.

Each RC-triggered clamp has a (relatively large) n-type MOS (nMOS) device connected between the corresponding ESD-protected node and an appropriate ground node. The nMOS device is controlled by the combination of an RC trigger and an inverter configured to turn on the nMOS device at the beginning of a positive ESD event and then turn off the nMOS device at the end of that positive ESD event. For example, RC-triggered clamp 314 includes (i) nMOS 316 connected between bus PADESD and ground node VSS, (ii) a series combination of resistance 318 and capacitance 320 also connected between PADESD and VSS, and (iii) inverter 322 connected between node 324 and the gate of nMOS 316.

Prior to an ESD event, there is no power supply, and nMOS device 316 is off. When a positive ESD event occurs at pad 306, the positive ESD voltage is applied to bus PADESD via diode 326. Due to the RC time constant of the RC trigger, the voltage at node 324 rises sufficiently slower than the voltage of bus PADESD. As a result, due to inverter 322, nMOS device 316 turns on, allowing current to flow through the nMOS device from PADESD to VSS. The voltage at node 324 rising due to the RC time constant eventually results in nMOS device 316 being turned off.

In one possible implementation, the RC time constant is designed to turn nMOS device 316 off after about one microsecond, and the size of nMOS device 316 is selected such that, after one microsecond, the voltage at bus PADESD will have safely returned to its nominal 2.5V level. In other implementations, other RC time constants and/or other nominal voltage levels are also possible.

When a negative ESD event occurs at pad 306, current flows from ground node VSSIO via diode 328 to the pad.

FIG. 3 also shows RC-triggered clamps 308, 310, and 312 for power supply nodes VCC, VCCAUX, and VCCIO, respectively. Each of these RC-triggered clamps has an RC trigger, an inverter, and an nMOS device configured to operate in a similar manner as the corresponding elements of RC-triggered clamp 314 described above for an analogous positive ESD event. Note that, when designed to have the same RC time constant (e.g., one microsecond), different sizes are selected for the nMOS devices for the different RC-triggered clamps based on the different maximum voltage levels of the corresponding ESD-protected nodes.

In addition, diodes 330, 332, and 334 provide negative-voltage ESD protection for the three power supply nodes in a manner analogous to that provided by diode 328 as described above.

Cross-connected diodes 336 and 338 provide mutual ESD protection for ground nodes VSS and VSSIO.

Diode stack 340 provides (relatively long-term) electrical overstress (EOS) protection in the event that an improperly large, positive, external voltage (e.g., sufficiently greater than 1.1V) is connected to the IC's power supply node VCC. Note that diode 330 provides EOS protection in the case of connection of an improperly large, negative, external voltage to node VCC.

Figure 4:
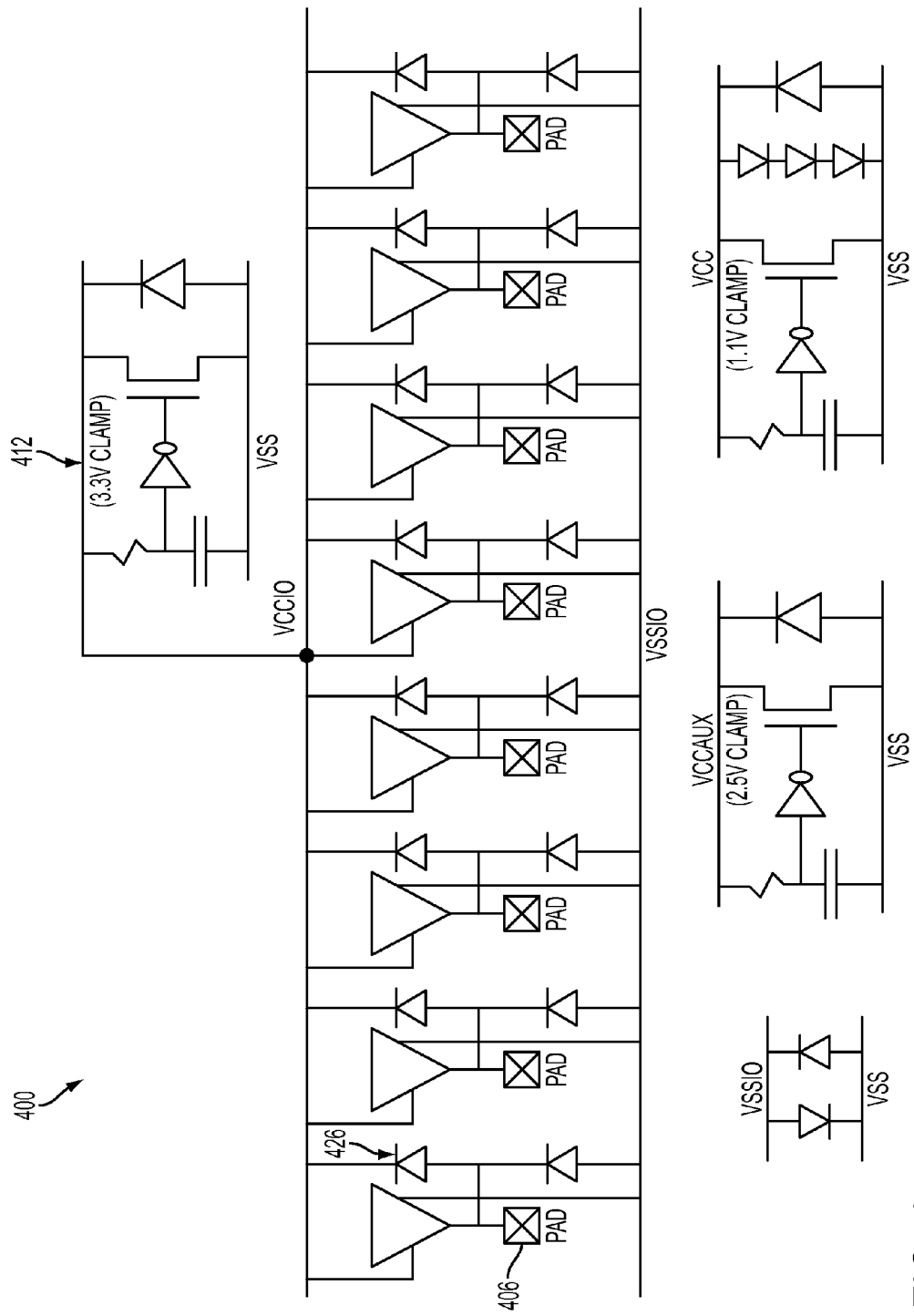
FIG. 4 shows a simplified schematic diagram of an exemplary I/I-ESD tile with ESD circuitry designed to provide ESD protection for eight I/O circuits in an I/O bank of the IC of FIG. 1 that does not have hot socket capability.

FIG. 4 shows a simplified schematic diagram of an exemplary I/O-ESD tile 400 with ESD circuitry designed to provide ESD protection for eight I/O circuits in an I/O bank of IC 100 of FIG. 1 that does not have hot socket capability. I/O-ESD tile 400 is similar to I/O-ESD tile 300 of FIG. 3, except that there is no intermediate PADESD bus and therefore no corresponding RC-triggered clamp analogous to clamp 314 of FIG. 3. Instead, a positive ESD event at node 406 will apply positive ESD voltage via diode 426 to power supply node VCCIO, which is protected by RC-triggered clamp 412. Otherwise, I/O-ESD tiles 300 and 400 are identical in form and function.

In the exemplary integrated circuit 100 of FIG. 1, each I/O bank has a plurality of instances of I/O-ESD tile 200 of FIG. 2, where each tile has either the configuration of I/O-ESD tile 300 of FIG. 3 or the configuration of I/O-ESD tile 400 of FIG. 4, depending on whether or not the I/O bank supports hot socket capability. Moreover, different I/O banks may have different numbers of tiles. As mentioned previously, it is desirable to reduce the amount of IC layout area dedicated to ESD circuitry.

In conventional implementations, each RC-triggered clamp is implemented with its own dedicated resistor and its own dedicated capacitor, which together take up almost half of the layout of the entire clamp. According to the disclosure, however, two or more different RC-triggered clamps are implemented with a single, shared resistor and a number of distributed capacitors that function collectively as a single, shared capacitor.

Figure 5:
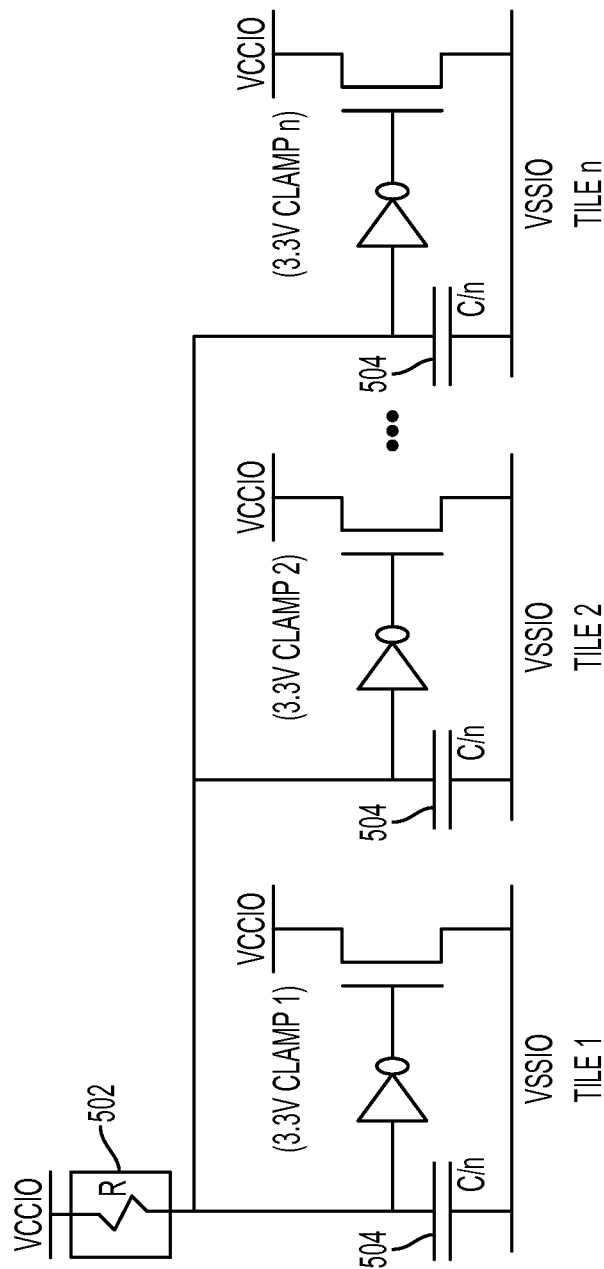
FIG. 5 shows a simplified schematic diagram of the n RC-triggered clamps employed to provide ESD protection for power supply node VCCIO for n different I/O-ESD tiles in a generic I/O bank having at least those n tiles.

FIG. 5 shows a simplified schematic diagram of the n RC-triggered clamps employed to provide ESD protection for power supply node VCCIO for n different I/O-ESD tiles in a generic I/O bank having at least those n tiles. As shown in FIG. 5, these n RC-triggered clamps are implemented using a single, shared, variable resistor 502 and n distributed capacitors 504, which, because they are mutually connected in parallel, function as a single, shared capacitor having a capacitance equal to the sum of the capacitances of the n distributed capacitors. As such, the layout required to implement the n RC triggers using the configuration of FIG. 5 is about n times smaller than the layout required to implement n RC triggers in a conventional configuration in which each RC trigger has its own dedicated resistor (each about the same size as resistor 502) and its own dedicated capacitor (each about the same size as the combined size of all n distributed capacitors 504).

This shared-resistor/distributed-capacitor scheme can be implemented for the RC-triggered clamps used to protect other nodes (e.g., VCC, VCCAUX, and PADESD) in the I/O bank as well as in the other I/O banks in the IC. As such, the layout savings can be significant. Furthermore, because the shared resistor can be positioned out of the way and because the remaining RC-triggered clamp circuitry has no resistor and a relatively small capacitor, it is easier to position the smaller remaining RC-triggered clamp circuitry within the I/O-ESD tile for the most optimal power bussing.

In one implementation, resistor 502 is a variable resistor, whose resistance can be selectively configured to be any of a plurality of different resistance levels. This variability allows different instances of the same ESD circuitry design to be used in different I/O banks having different numbers (n) of I/O-ESD tiles and yet still provide approximately the same (e.g., one-microsecond) RC time constant.

Figure 6:
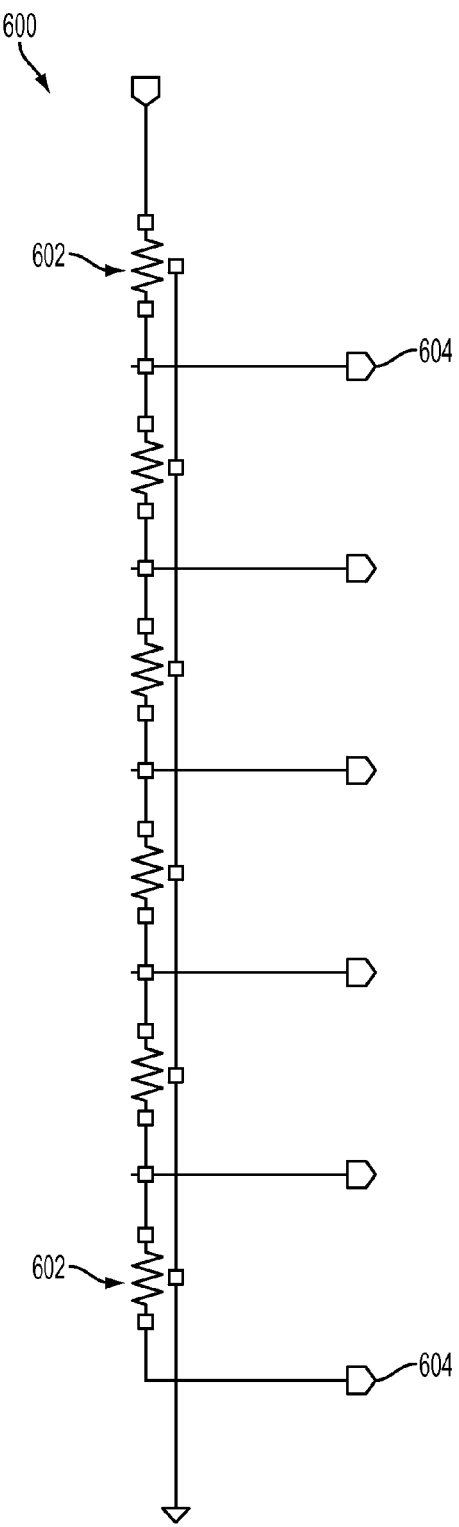
FIG. 6 shows a simplified schematic diagram of an exemplary variable resistor that can be used to implement the shared resistor of FIG. 5.

FIG. 6 shows a simplified schematic diagram of an exemplary variable resistor 600 that can be used to implement shared resistor 502 of FIG. 5. As shown in FIG. 6, variable resistor 600 has six resistive elements 602 connected in series with six taps 604 located at different positions along the series combination. Variable resistor 600 can be implemented as a variable poly resistor having different tap points along the length of the poly resistor. By selecting different pairs of taps, different resistance levels can be achieved. Other implementations may have variable resistors having other numbers of series-connected resistive elements.

Although the disclosure has been described in the context of an IC having three power supplies and eight I/O banks of I/O-ESD tiles, where each tile has eight I/O circuits, those skilled in the art will understand that ICs of the disclosure may have different numbers of I/O circuits per tile and/or different numbers of I/O banks and/or different numbers of power supplies.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

It should be appreciated by those of ordinary skill in the art that any block diagrams herein represent conceptual views of illustrative circuitry embodying the principles of the invention.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit comprising at least a first input/output (I/O) bank comprising at least two tiles, each of the at least two tiles comprising:
   one or more I/O circuits; and
   electrostatic discharge (ESD) circuitry configured to provide ESD protection for the one or more I/O circuits in the tile, wherein:
   the ESD circuitry of each of the at least two tiles comprises a first resistance-capacitance (RC)-triggered clamp;
   the first I/O bank comprises a shared first resistor and a plurality of distributed first capacitors, wherein:
   the shared first resistor is shared by the first RC-triggered clamps in the at least two tiles; and
   the first RC-triggered clamp in each of the at least two tiles has its own distributed first capacitor connected in parallel with the rest of the distributed first capacitors for the rest of the first RC-triggered clamps in the at least two tiles.

2. The integrated circuit of claim 1, wherein:
   the ESD circuitry in each of the at least two tiles of the first I/O bank further comprises a second RC-triggered clamp;
   the first I/O bank further comprises a shared second resistor and a plurality of distributed second capacitors, wherein:
   the shared second resistor is shared by the second RC-triggered clamps of the at least two tiles; and
   the second RC-triggered clamp in each of the at least two tiles has its own distributed second capacitor connected in parallel with the rest of the distributed second capacitors for the rest of the second RC-triggered clamps of the at least two tiles.

3. The integrated circuit of claim 1, wherein the ESD circuitry in each of the at least two tiles of the first I/O bank comprises a different RC-triggered clamp for each of a plurality of power supply nodes of the integrated circuit.

4. The integrated circuit of claim 3, wherein the ESD circuitry in each of the at least two tiles of the first I/O bank further comprises an RC-triggered clamp for a bus associated with hot socket capability of the first I/O bank.

5. The integrated circuit of claim 1, wherein the shared first resistor is a variable resistor that can be selectively configured to provide any of a plurality of different resistance levels such that different instances of the ESD circuitry can be configured in different I/O banks of the integrated circuit having different numbers of tiles.

6. The integrated circuit of claim 5, wherein the different instances of the ESD circuitry in the different tiles of the different I/O banks have equal time constants.

7. The integrated circuit of claim 1, wherein:
the first RC-triggered clamp is configured to provide ESD protection for a first power supply node of the integrated circuit; and
the ESD circuitry further comprises:
  a second RC-triggered clamp configured to provide ESD protection for a second power supply node of the integrated circuit; and
  a third RC-triggered clamp configured to provide ESD protection for a third power supply node of the integrated circuit.

8. The integrated circuit of claim 7, wherein:
the first, second, and third power supply nodes have three different maximum voltage levels; and
the first, second, and third RC clamps have three differently sized shunt transistors corresponding to the three different maximum voltage levels.

9. The integrated circuit of claim 7, wherein the ESD circuitry further comprises a fourth RC-triggered clamp configured to provide ESD protection for a bus associated with hot socket capability of the first I/O bank.

10. The integrated circuit of claim 1, wherein the ESD circuitry further comprises one or more diodes configured to provide ESD protection for negative ESD events.

11. The integrated circuit of claim 1, wherein:
the ESD circuitry in each of the at least two tiles of the first I/O bank further comprises a second RC-triggered clamp;
the first I/O bank further comprises a shared second resistor and a plurality of distributed second capacitors, wherein:
  the shared second resistor is shared by all of the second RC-triggered clamps in the first I/O bank; and
  the second RC-triggered clamp in each of the at least two tiles has its own distributed second capacitor connected in parallel with the rest of the distributed second capacitors for the rest of the second RC-triggered clamps in the first I/O bank;
the ESD circuitry in each of the at least two tiles of the first I/O bank comprises a different RC-triggered clamp for each of a plurality of power supply nodes of the integrated circuit;
the ESD circuitry in each of the at least two tiles of the first I/O bank further comprises an RC-triggered clamp for a bus associated with hot socket capability of the first I/O bank;
the shared first resistor is a variable resistor that can be selectively configured to provide any of a plurality of different resistance levels such that different instances of the ESD circuitry can be configured in different I/O banks of the integrated circuit having different numbers of tiles;
the different instances of the ESD circuitry in the different tiles of the different I/O banks have equal time constants; and
the ESD circuitry further comprises one or more diodes configured to provide ESD protection for negative ESD events.

* * * * *